US010429522B1

(12) United States Patent
Kamieniecki

(10) Patent No.: US 10,429,522 B1
(45) Date of Patent: Oct. 1, 2019

(54) ELECTROSTATIC HOLE TRAPPING RADIATION DETECTORS

(71) Applicant: Emil Kamieniecki, Bedford, MA (US)

(72) Inventor: Emil Kamieniecki, Bedford, MA (US)

( * ) Notice: Subject to any disclaimer, the term of this patent is extended or adjusted under 35 U.S.C. 154(b) by 0 days.

(21) Appl. No.: 15/987,751

(22) Filed: May 23, 2018

(51) Int. Cl.
*G01T 1/20* (2006.01)
*G01T 1/24* (2006.01)
*H01L 27/146* (2006.01)
*G01T 1/202* (2006.01)
*G01T 3/08* (2006.01)

(52) U.S. Cl.
CPC .......... *G01T 1/2018* (2013.01); *G01T 1/2023* (2013.01); *G01T 1/24* (2013.01); *G01T 3/08* (2013.01); *H01L 27/14676* (2013.01); *H01L 27/14696* (2013.01)

(58) Field of Classification Search
CPC ........... G01T 1/24; G01T 3/08; G01T 1/2018; G01T 1/2023; H01L 27/14676; H01L 27/14696
See application file for complete search history.

(56) References Cited

U.S. PATENT DOCUMENTS

| 7,898,280 | B2 | 3/2011 | Kamieniecki | |
|---|---|---|---|---|
| 8,896,338 | B2 | 11/2014 | Kamieniecki | |
| 2007/0080301 | A1* | 4/2007 | Bell | G01T 1/24 250/370.12 |
| 2013/0001424 | A1* | 1/2013 | Kusner | G01T 3/06 250/362 |

OTHER PUBLICATIONS

Awadalla, S.A. et al., "Characterization of Detector-Grade CdZnTe Crystals Grown by Traveling Heater Method (THM)" Journal of Crystal Growth 312, Issue 4, Elsevier (2010) pp. 507-513 (ISSN 0022-0248).
Becla, Piotr et al., "Study of Defects in a heavily irradiated high-resistivity CdZnTe gamma detectors" E-MRS 2013 Fall Meeting, Warsaw, Poland (Sep. 16-20, 2013) pp. 1-22.
Chen, Henry et al., "Spectral Response of THM Grown CdZnTe Crystals" IEEE Transactions on Nuclear Science, vol. 55, No. 3 (Jun. 2008) pp. 1567-1572.
Kamieniecki, Emil, J. "Defect specific photoconductance: Carrier recombination through surface and other extended crystal imperfections" Appl. Phys. 112 (2012) pp. 063715-1 to 063715-8.
Kamieniecki, Emil, "Effect of defect clusters on carrier recombination in high-resistivity CdZnTe" J. Appl. Phys. 114, (2013) pp. 193701-1 to 193701-4.
Kamieniecki, Emil, "Effect of charge trapping on effective carrier lifetime in compound semiconductors: High resistivity CdZnTe" J. Appl. Phys. 116 (2014) pp. 193702-1 to 193702-5.
Luke, P.N. et al., "Electrode Design for Coplanar-Grid Detectors" 1996 IEEE Nuclear Science Symposium, Los Angeles, California (Nov. 12-15, 1996) pp. 1-7.

(Continued)

*Primary Examiner* — Kiho Kim
(74) *Attorney, Agent, or Firm* — David Millers

(57) ABSTRACT

A Defect Specific Lifetime Analysis (DSLA) can measure electrostatic hole trapping characteristics of semiconductors to identify crystals for use in radiation detectors. A semiconductor crystal with high electrostatic hole trapping can be employed in radiation detectors having simplified signal processing circuits and/or high radiation energy measurement resolution.

14 Claims, 5 Drawing Sheets

(56) References Cited

OTHER PUBLICATIONS

Mathew, Xavier, "Photo-induced current transient spectroscopic study of the traps in CdTe" Elsevier, Solar Energy Materials and Solar Cells 76 (2003) pp. 225-242.
Redus, Robert, "Charge trapping in XR-100T-CdTe and -CZT detectors" ANCZT-2 Rev. 3 (Nov. 2007) pp. 1-17.
Sellin, P.J. et al., "Drift Mobility and Mobility-Lifetime Products in CdTeCl Grown by the Travelling Heater Method" IEEE Transactions on Nuclear Science, vol. 52, No. 6 (Dec. 2005) pp. 3074-3078.
Sturm, Benjamin W., et al. "Coplanar Grid CdZnTe Detectors for Space Science Applications" Hard X-Ray and Gamma-Ray Detector Physics VI, Proc. of SPIE, vol. 5540, SPIE, Bellingham, WA (2004) pp. 14-21.
Mang, Qiushi et al., Sensors 13 (2013) pp. 2447-2474 (ISSN 1424-8220).

\* cited by examiner

ELECTROSTATIC HOLE TRAPPING RADIATION DETECTORS

BACKGROUND

Current semiconductor radiation detectors employ semiconductor crystals that interact with ionizing radiation to produce electron-hole pairs in the semiconductor. A detector may then detect the electrons and holes electrically, e.g., by collecting charges at electrodes in a photoconductive detector, or from photons emitted when electrons and holes recombine, e.g., as in a scintillation counter. The energy of the ionizing radiation may be determined from the electrical or light signal thus produced because, in general, a particle of radiation interacting with a semiconductor creates a number of electrons-hole pairs that indicates the energy of the radiation particle.

The efficiency of charge carrier collection in photoconductive detectors generally depends on the "trapping length," which is the mean distance traveled by a charge carrier in the semiconductor crystal. A semiconductor crystal particularly needs to provide a "trapping length" that is long enough that the charge carriers are likely to travel from their creation points to collecting electrodes. The trapping length depends on the lifetime of charge carriers in a semiconductor and may be expressed as a product of the carrier lifetime, the carrier mobility, and the electric field resulting from a bias voltage applied in the detector. Recombination and trapping of charge carriers limit the carrier lifetimes in a semiconductor and may be the most important factors limiting the efficiency for collection of the charge carriers.

The disparity of trapping lengths of electrons and holes in the semiconductor crystals further complicates efficient collection of charge carriers. In CdTe based semiconductors such as CdZnTe (CZT) and in other wide bandgap, high Z compound semiconductors such as $HgI_2$, the mobility of holes is much lower than mobility of electrons. The slower movement of holes can slow detection of the holes and distort the shape of the electrical signal generated when a radiation particle interacts with the semiconductor crystal. The low drift velocity of holes in the semiconductors used in photoconductive detectors therefore has an adverse effect on the response and performance of the photoconductive detectors. A photoconductive detector can reduce the effect of the low drift velocity of holes by implementing a single-polarity charge sensing mode, which reduces the contribution of holes to the measurement signal. In a Coplanar Grid (CPG) detector, a single-polarity charging mode is implemented using electrodes formed as two grids and operated in a subtraction mode that subtracts collected hole charge from the collected electron charge. [See Benjamin W. Sturm, Zhong He, Edgar Rhodes, Thomas H. Zurbuchen, Patrick L. Koehn, Proc. of SPIE Vol. 5540 (SPIE, Bellingham, W A, 2004) and Glenn F. Knoll, Radiation Detection and Measurement (John Wiley & Sons, Inc., 4th ed., 2010.] An alternative solution to the problem of holes having the low mobility in a photoconductive detector is based on a planar detector configuration with a continuous cathode electrode and a pixelated anode electrode that improves energy resolution by minimizing sensitivity to the motion of the positive charges (holes) that may not be completely collected. [See Glenn F. Knoll, Radiation Detection and Measurement, John Wiley & Sons, Inc., 4th ed., 2010.] However, these detector arrangements have complex electrode configurations and complex signal management electronics that increase the fabrication cost of such detectors and reduce the reliability of the detectors.

The CPG and pixelated detector configurations for electrodes still do not resolve issues associated with trapping and recombination of charge carriers limiting carrier lifetime. Improving carrier lifetimes generally requires control of crystal growth processes so that the semiconductor crystals used in detectors have fewer defects or other features that reduce charge carrier lifetimes. Further, manufacture of semiconductor radiation detectors generally requires characterization and monitoring of the semiconductors properties that affect radiation detectors performance. For wide-bandgap semiconductors, a standard approach tests semiconductor crystals by measuring a product (commonly called the "mu-tau product") of carrier mobility and lifetime. The goal of the testing is to identify semiconductor crystals having a "mu-tau product" high enough for use in semiconductor detectors. However, conventional measurements of the "mu-tau product" do not reflect the effects associated with the electrostatic trapping of minority carriers at the electrostatic potential barrier formed at or around extended defects. This leads to a poor correlation of the measured "mu-tau product" of the modern detector-grade crystals with the performance of semiconductor-based radiation detectors and specifically leads to poor correlation with the energy resolution of the radiation detectors.

SUMMARY

In accordance with an aspect of the invention, semiconductor crystals providing significant electrostatic trapping of minority carriers, e.g., electrostatic trapping of holes, are selected for use in photoconductive radiation detectors. The electrostatic trapping of the minority carriers allows implementation of a single-polarity charge sensing mode that may eliminate need for a dual-grid and dual-voltage arrangement such as used in Coplanar Grid Detectors (CGDs) and may allow use of simple electrode structures. Electrostatic Hole Trapping (EHT) radiation detectors can improve radiation detection performance independent of the electrode configuration, and a single-polarity EHT radiation detector can employ less complex signal management electronics. An important aspect of EHT radiation detectors is elimination of the dual-voltage bias used in current CGD detectors, which reduces the effect of high voltage at the input of a high sensitivity preamplifier and therefore improves both performance and reliability of detector electronics. Simplified electrode configuration of the EHT radiation detectors eliminates or at least reduces complexity when compared to pixelated detectors in which electrical connection and separate electronic readout channels must be provided for each individual pixel.

The electrostatic trapping of low-mobility minority carriers, e.g., holes in n-type CdZnTe, can enhance the contribution of high-mobility majority carriers, e.g., electrons in n-type CdZnTe, to the charge collected at the EHT detector electrodes. In conventional semiconductor radiation detectors, the difference in electron and hole mobilities generally results in a time difference in collecting minority and majority carriers at respective electrodes, and the difference in timing complicates signal processing and reduces the performance of conventional semiconductor radiation detectors. In the EHT radiation detectors the spread of the space-charge regions electrostatically trapping holes over the entire volume of the semiconductor reduces (or eliminates) carrier collection delay, simplifying signal processing and improving detector performance.

Electrostatic hole trapping also suppresses hole trapping at point defects responsible for the crystal polarization phenomenon that reduces the performance of high-flux radiation detectors.

The manufacture of EHT detectors may employ a process for selection of semiconductor crystals with large enough volume of the space-charge regions (electrostatic potential barriers) to electrostatically trap holes. The selection process may be accomplished using non-contact RF-based Defect Specific Lifetime Analysis (DSLA). The Defect Specific Lifetime Analysis (DSLA), a non-contact variant of a Defect Specific Photoconductance measurements, allows characterization of the crystal properties critical for detector performance. Specifically, DSLA allows for the determination of the electrostatic hole trapping by extended crystal imperfections and electron trapping by point defects. These two factors are the most critical processes affecting a radiation detector's performance. Use of these parameters allows selection of crystals with desirable hole-trapping characteristics and electron trapping rates.

BRIEF DESCRIPTION OF THE DRAWINGS

The drawings illustrate examples for the purpose of explanation and are not of the invention itself. Use of the same reference symbols in different figures indicates similar or identical items.

DETAILED DESCRIPTION

A photoconductive radiation detector can determine the energy of a radiation particle from the charges that the detector collects from a semiconductor crystal within a specific time interval from when the radiation particle interacts with the semiconductor crystal. Hence, delays in the charges reaching a collecting electrode and variations of the delays due to distance of the interaction point to the collecting electrode reduce the sensitivity and the energy resolution of a photoconductive radiation detector. The main factors affecting this delay are associated with the lower mobility charge carriers (holes in most wideband semiconductors such as CdTe-based and $HgI_2$ semiconductors), the difference in mobility between electrons and holes, and trapping/detrapping of the higher mobility carriers.

Figure 1:
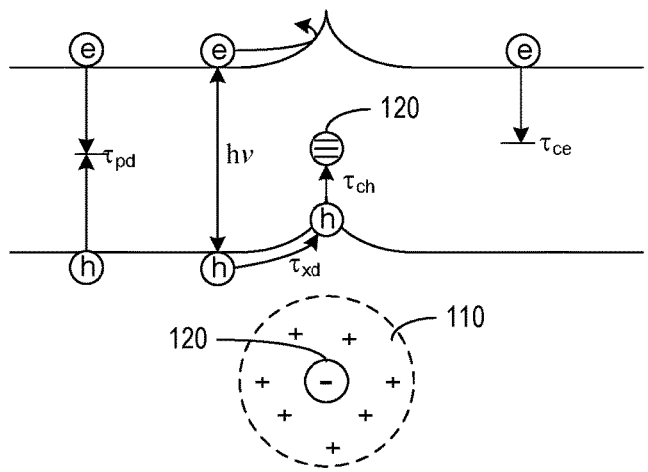
FIG. 1 shows a schematic energy level diagram illustrating effects of crystal defects on recombination and trapping of electrons and holes generated by ionizing radiation in a wide-bandgap semiconductor.

FIG. 1 shows a schematic energy level diagram for a wide bandgap semiconductor. A photon (or other radiation particle) with an energy hv exceeding the bandgap of a semiconductor can produce one or more electron-hole pairs, which may interact with some basic types of defects in the semiconductor crystal. For example, point defects may act as recombination centers that facilitate electron and hole recombination, which may be characterized by a recombination lifetime $\tau_{pd}$. Another type of point defects may temporarily trap electrons, and the effects of point defect electron trapping centers in a semiconductor may be characterized by an electron trapping time constant $\tau_{ce}$. Extended defects 120, which form surrounding space-charge regions 110, may tend to repel radiation generated electrons and electrostatically trap holes in the space-charge region 110, and the electrostatic hole trapping effect of extended defects 120 may be characterized by a time constant $\tau_{xd}$. In addition, the electrostatically trapped holes may transition to defect states, which form the core of extended defects 120, and the transitions of a hole captured by extended defects 120 may be characterized by a time constant $\tau_{ch}$. The probability of a transition of an electrostatically trapped hole to the extended defect 120 may be relatively small.

In common semiconductor materials used in radiation detectors, e.g., CdZnTe and $HgI_2$, hole mobility is about order of magnitude lower than electron mobility, therefore, reducing the effect of hole collection at the electrode(s) is an essential element of improvement of detector performance. In accordance with an aspect disclosed herein, this goal can be achieved by selecting semiconductor crystals with a high density of extended defects that form electrostatic potential barriers that trap and immobilize holes in the space-charge regions formed around the extended defects. The density of extended defects required to achieve the desired electrostatic trapping in a particular detector implementation may depend on the specific configuration of the detector and may be determined experimentally by comparing defect characterization data for semiconductor crystals with the performance of detectors using the semiconductor crystals.

A commonly used characterization of wide-bandgap semiconductors is the "mu-tau product," which is a product of charge mobility and lifetime. However, the "mu-tau product" cannot detect the electrostatic trapping of minority carriers at the electrostatic potential barrier formed around extended defects since the time constant $\tau_{xd}$ of such intraband transitions is much shorter than typical time resolution of conventional "mu-tau product" measurements.

Defect Specific Lifetime Analysis (DSLA) allows detection or measurement of the electrostatic trapping of minority carriers in semiconductor crystals, enables selection of the semiconductor crystals having a desired density of extended defects for electrostatic trapping of minority carriers in a radiation detector, and provides guidance for improvement of the crystal growth processes to provide semiconductor crystals with the desired density of extended defects. DSLA is a free carrier absorption based, non-contact RF-variant of the Defect Specific Photoconductance method that allows characterization of crystal properties critical for detector performance. DSLA process are described, for example, in U.S. Pat. No. 7,898,280 B2, U.S. Pat. No. 8,896,338 B2, and E. Kamieniecki, J. Appl. Phys. 112, 063715 (2012), which are hereby incorporated by reference in their entirety. DSLA can provide indications of the time constant $\tau_{xd}$ associated with the electrostatic hole trapping by extended crystal defects and of the time constant $\tau_{ce}$ associated with electron trapping by point defects. These two factors are the most critical processes affecting radiation detectors performance. Use of these parameters allows selection of crystals with desirable hole-trapping and electron-trapping rates.

Figure 2A:
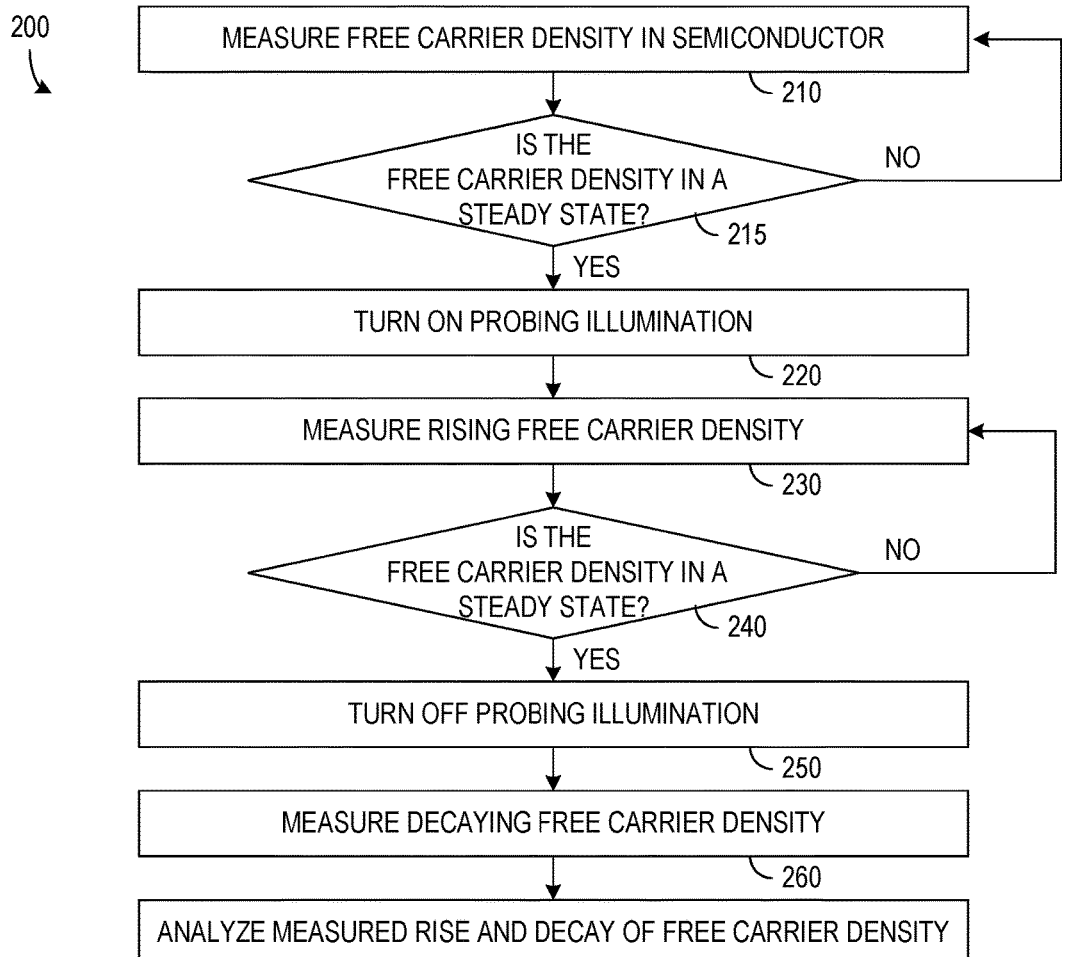
FIG. 2A is a flow diagram of a process for determining the photo-response of a semiconductor crystal.

FIG. 2A is a flow diagram of an example DSLA process 200 for characterizing a semiconductor crystal. Process 200 begins with an initial measurement block 210 that measures the free carrier density in a semiconductor crystal. For process block 210, the semiconductor crystal may be in dark after a previous illumination pulse. The free carrier density may be measured, for example, by applying to the semiconductor crystal RF radiation having a photon energy less than the bandgap of the semiconductor and measuring the reflected RF radiation. In general, the amount of RF radiation that the semiconductor crystal absorbs depends on the free charge carrier density in the semiconductor, so that measurement of the reflected RF radiation indicates the free charge carrier density in the semiconductor. A decision block 215 then determines whether the semiconductor crystal is in a state, e.g., a baseline state in which the semiconductor crystal is in thermal equilibrium and is not affected by recent illumination that elevates the free charge carrier density. If block 215 determine the free carrier density is changing, process 200 waits and repeats the measurement of the free carrier density in block 210. If the semiconductor crystal is in a steady state, process 200 proceeds.

A block 220 represents exposing the semiconductor crystal to a probing illumination pulse having photon energy exceeding the bandgap of the semiconductor crystal, so that the probing illumination increases the density of the free charge carriers and decreases intensity of the reflected RF radiation found in a measurement 230. The change in the reflected RF radiation thus provides a measure of the change in the free carrier density or equivalently of the excess free carriers.

Figure 2B:
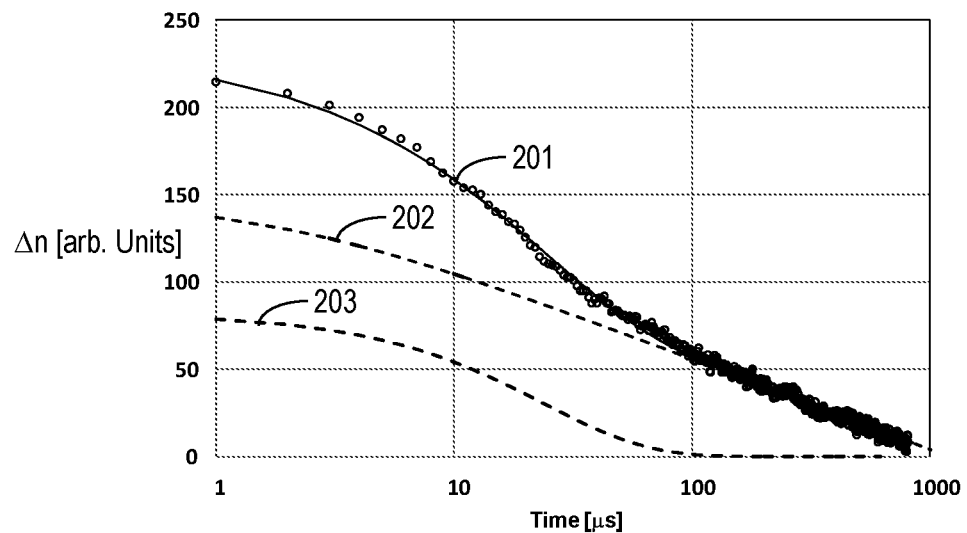
FIG. 2B shows graphs of a photo-response typical for a CdZnTe semiconductor crystal, an exponential component of the photo-response decay, and a logarithmic component of the photo-response decay.

Blocks 230 and 240 measure the excess free carrier density in the semiconductor crystal and determine whether the (excess) free carrier density in the semiconductor crystal has reached another steady state. If the carrier density is still rising, the probing illumination continues until the density of the excess charge carrier density reaches a steady-state condition, e.g., is constant for a suitable period of time. After reaching the steady-state condition, block 250 turns off the probing illumination, causing a decay of the excess carrier density in the semiconductor crystal. Block 260 measures decay of the carrier density over time, for example, by measuring the RF radiation reflected from the semiconductor crystal at a sequence of times. The measurements of the decay of carrier density $\Delta n$ are represented as a decay curve 201 such as shown in FIG. 2B.

A sub-process 270 (FIG. 2A) may analyze the rise, e.g., measurements from block 230, and the decay, e.g., measurements from block 260, to characterize the semiconductor crystal. Analysis of decay process in 270 may particularly fit the recorded decay curve 201 to the sum of a logarithmic decay component 202 and an exponential decay component 203. Logarithmic decay component 202 corresponds to the effects of the extended defect component and particularly to the excess electron density $\Delta n_{sc}$ in the extended-defects-controlled regions as given by an Equation (1). Exponential decay component 203 corresponds to the effects of point defects and particularly to the excess electron density $\Delta n_{pd}$ in the point-defect-controlled regions as given by an Equation (2). In Equations (1) and (2), t is the time. In Equation (1), $G_{sc}$ is the total effective carrier generation rate in the extended-defect controlled regions that includes both the radiation induced generation rate in these regions and the minority carriers diffusing into the vicinity of the extended defects from outside of these regions, $\tau_0$ depends on the initial conditions of the photo-response decay measurement, and $\tau_e$ represents carrier recombination time constant. In Equation (2), $G_{pd}$ is a total effective carrier generation rate in the point-defect controlled regions, and $\tau_{pd}$ is the carrier lifetime in the point-defect-controlled regions. A curve fit of the logarithmic decay 202 and exponential decay 203 (as shown in FIG. 2B) allows for determination of all the above listed parameters with $G_{sc}$ and $G_{pd}$ given as a percentage of the total carrier generation rate $G=G_{sc}+G_{pd}$.

$$\Delta n_{sc} = -G_{sc}\tau_0 \ln\left(\frac{\tau_0 + t}{\tau_e}\right) \qquad \text{Equation (1)}$$

$$\Delta n_{pd} = G_{pd}\tau_{pd} \exp(-t/\tau_{pd}) \qquad \text{Equation (2)}$$

For a hole to be trapped by the extended defects, the hole needs to be within the defect space-charge region of an extended defect. Therefore, the probability $1/\tau_{xd}$ of electrostatic trapping of holes is proportional to the total volume $V_{sc}$ of the space-charge regions surrounding extended defects in the semiconductor material, and the space-charge region volume $V_{sc}$ can be expressed as a percentage of the total volume V as shown in Equation (3). Further, since the combined effective generation rate in the corresponding regions is proportional to the total of the effective volumes of these regions, the total space-charge region volume $V_{sc}$ is related to the effective carrier generation rate $G_{sc}$ in the space-charge regions of extended defects and the total point-defect controlled region volume $V_{pd}$ is related to the effective carrier generation rate $G_{pd}$ in point-defect controlled regions, where $G_{sc}$ and $G_{pd}$ may be determined from the photo-response decays of Equations (1) and (2).

$$1/\tau_{xd} \propto V_{sc}/V \qquad \text{Equation (3)}$$

$$\frac{V_{sc}}{V} = \frac{G_{sc}}{G_{sc} + G_{pd}} \qquad \text{Equation (4)}$$

The relative volumes of the space-charge regions in a typical operation of the low-flux radiation detectors may be larger than those estimated from DSLA using Equation (4) because the DSLA measurement are performed under higher carrier injection level approaching operation conditions of the high-flux X-ray radiation detectors and pile up of holes in the space charge regions while reaching steady-state conditions of a DSLA process reduces the electrostatic potential barriers and total effective volume of the space-charge regions. This difference decreases with increasing volume of the space-charge regions. In spite of this limitation $V_{sc}/V$ estimated from DSLA can be used effectively as a relative measure of the space-charge regions volume in semiconductor crystals.

Figure 3:
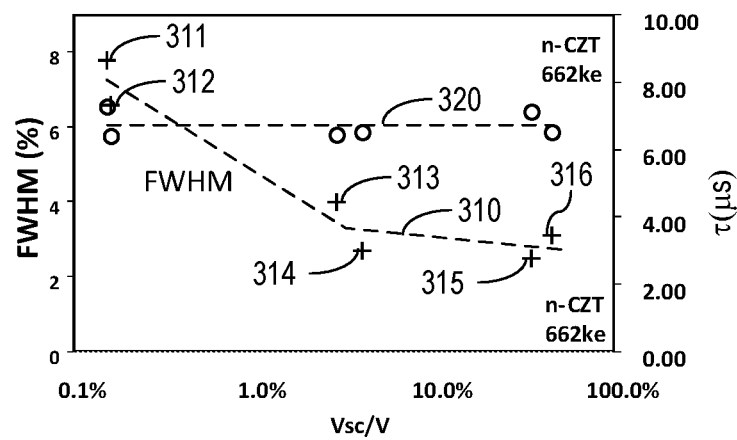
FIG. 3 illustrates the dependence of the energy resolution of a detector, the FWHM of radiation signals, and the electron trapping time constant $\tau_{ce}$ on the relative volume of space-charge regions surrounding extended defects in a semiconductor crystal.

The Full Width at Half Maximum (FWHM) of an electrical signal that a radiation detector collects when a particle of radiation interacts with a semiconductor in the detector is typically used as a formal definition of the energy resolution of the detector. FIG. 3 shows a plot 310 of how the FWHM of a detector signal depends on the space-charge volume ratio $V_{sc}/V$ of the semiconductor crystal used in the detector. In particular, data points 311 and 312 correspond to semiconductor crystals having a relatively low space-charge volume ratio $V_{sc}/V$ and are associated with detector signals having a wider FWHM and accordingly lower energy resolution, and data points 315 and 316 correspond to semiconductor crystals having relatively high space-charge volume ratio $V_{sc}/V$ and are associated with detector signals having a narrower FWHM and accordingly better energy resolution. Performing measurements of all crystals under the same conditions offers a practical approach to selection of crystals with large enough total space-charge volume $V_{sc}$ to achieve a desired energy resolution for a detector.

The data points 311 to 316 shown in FIG. 3 more specifically represent measurements using three different ingots of In-doped 10% CdZnTe crystals grown by seeded Traveling Heater Method (THM). In particular, two samples per each ingot were taken adjacent to the crystals used to fabricate radiation detectors, and plot 310 shows that the space-charge volume ratio $V_{sc}/V$ measurements of the samples are well correlated with the measured energy resolutions FWHM in detectors using the crystals taken from the same ingot. In particular, data points 311 and 312 correspond to samples from a first ingot and provided relatively low measured space-charge volume ratio $V_{sc}/V$, and detectors fabricated using the crystals from the first ingot provided relatively low energy resolution. Data points 315 and 316 correspond to samples from a third ingot that provided relatively high measured space-charge volume ratio $V_{sc}/V$, and detectors fabricated using the crystals from the third ingot provided relatively high energy resolution. Good reproducibility of the performance confirms the validity of using DSLA determinations of relative space-charge volumes for selection of crystals with optimal space-charge region volumes.

Recombination/trapping properties of crystals associated with point defects can be determined from the analysis of the initial, rising segment of the photo-response after turning on the probing illumination pulse using methodology described in E. Kamieniecki, J. Appl. Phys. 116, 193702 (2014). The increase $\Delta n$ of the free electron density after turning on the illumination pulse can be described by the exponential function shown in Equation (5). In Equation (5), t is time, $\tau_c$ is an effective capture time constant, and G is the generation rate of carriers. Since G corresponds to the carrier injection levels exceeding those in a typical operation of the low-flux radiation detectors and approaching operating conditions of the high-flux radiation detectors, the effective capture time constant $\tau_c$ includes both recombination ($\tau_{pd}$) and trapping ($\tau_{ce}$) of carriers by point defects as indicated in Equation (6).

$$\Delta n = G\tau_c \left[1 - \exp\left(-\frac{t}{\tau_c}\right)\right] \quad \text{Equation (5)}$$

$$\frac{1}{\tau_{ce}} = \frac{1}{\tau_c} - \frac{1}{\tau_{pd}}. \quad \text{Equation (6)}$$

Since, in general, $\tau_c$ and $\tau_{pd}$ may depend on the density of free electrons, measurements are performed at carrier densities corresponding to the linear approximation range (small excess carrier densities).

FIG. 3 also shows a plot of the carrier lifetime and confirms previously discussed poor correlation of the "mu-tau product" with the performance of radiation detectors and specifically with their energy resolution. It should be noted that low-grade crystals with high density of defects may show better correlation with the "mu-tau product" due to larger variations of the defect density. At typical operation conditions of the low-flux radiation detectors, the density of generated carriers is very small and most of the holes, in the presence of extended defects, are electrostatically trapped. Under such conditions the carrier recombination in the detector is negligible and mean free time $\tau$ in the "mu-tau product" $\mu\tau$ is equal to $\tau_{ce}$ as expressed by Equation (7).

$$\mu\tau/\mu \cong \tau_{ce}. \quad \text{Equation (7)}$$

The poor correlation of the "mu-tau product" with detector performance in the presence of extended defects and electrostatic hole trapping are a major issue in fabrication of detectors. Since the "mu-tau product" is one of the most frequently used metrics of crystal quality in detector fabrication, this limits the process monitoring capabilities of radiation detector manufacturing operations. This also limits the feedback that the "mu-tau product" can provide to the development of the crystal growth technology. Therefore, the capability of DSLA to monitor electron trapping may have an important impact on selection of crystals and the optimization of crystal growth process.

Figure 4:
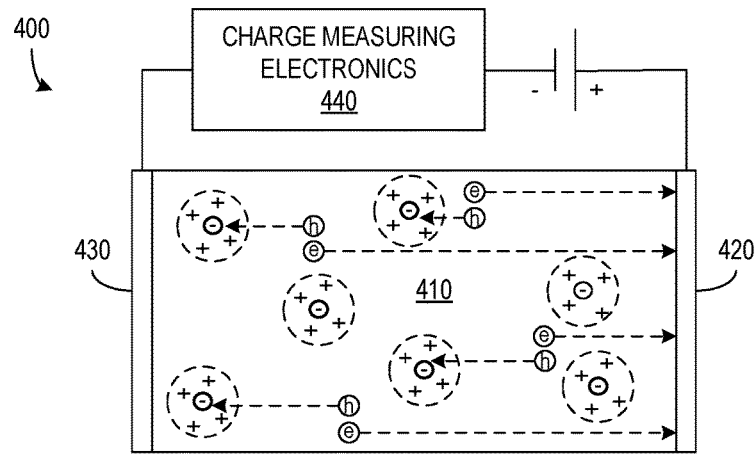
FIG. 4 is a schematic of an electrostatic hole trapping radiation detector employing a single-polarity charge sensing mode.

In accordance with an aspect disclosed herein, electrostatic trapping of minority carriers allows implementation of a single-polarity charge sensing mode that eliminates the need for complex electrode arrangements such as a dual-grid arrangement utilized in the Coplanar Grid Detectors (CGD) or pixelated anode requiring complex electrical connection and a separate electronic readout channel connected to each individual pixel in the pixelated detectors. FIG. 4 is a block diagram of an Electrostatic Hole Trapping (EHT) radiation detector 400 in accordance with an implementation of the present invention. EHT radiation detector 400 includes a semiconductor block 410 having a space-charge volume ratio $V_{sc}/V$ that is in a target range that was determined to be desirable for radiation detector 400. In particular, semiconductor block 410 may be a wide bandgap semiconductor crystal such as CdZnTe, HgI2, CdTe, or CdMnTe, and the space-charge volume ratio $V_{sc}/V$ of block 410 may be at the target level or in the target range. For example, the space-charge volume ratio $V_{sc}/V$ of semiconductor block 410 may have been measured using a DSLA process described above and found to be at the target level or in the target range, or block 410 may have been cut from an ingot having samples that were measured and found to have a space-charge volume ratio $V_{sc}/V$ at the target level or in the target range. In general, a semiconductor crystal with a space-charge volume ratio $V_{sc}/V$ that is too low will not trap enough holes when used in a photoconductive detector, and a semiconductor crystal with a space-charge volume ratio $V_{sc}/V$ that is too high may affect carrier mobility in the photoconductive radiation detector. Accordingly, desirable semiconductor crystals for a specific type of a photoconductive radiation detector will have space-charge volume ratio $V_{sc}/V$ in a target range for that type of detector.

Electrodes 420 and 430 are electrically connected to semiconductor crystal 410, e.g., on opposite faces of crystal 410, and are biased during operation of radiation detector 400 to collect electrons at electrode 420. In particular, when a radiation particle interacts with semiconductor crystal 410 to create electron-hole pairs, an electric field in semiconductor crystal 410 drives freed electrons toward positive electrode 420. Some detector configurations may use more than one positive collecting electrode 429, e.g., to provide imaging. The electrons arrive at electrode 420 after delays that depend on the location where the electron was generated, the mobility of the electrons in semiconductor crystal 410, and the strength of the electric field in semiconductor crystal 410. Positive electrode 420 may particularly have an ohmic contact with semiconductor crystal 410 to collect electrons from semiconductor crystal 410. In contrast, negative electrode 430 may be a blocking electrode that blocks injection of electrons from electrode 430 into semiconductor crystal 410. In conventional radiation detectors, the holes would be collected at the negative electrode over a wide range of delay times due to the lower mobility of the holes and would cause the combined measurement signal to be wide and provide a low energy distribution. In detector 400, the holes are likely to be trapped in space-charge volume $V_{sc}$ surrounding the extended defects in semiconductor crystal 410 reducing effect of delayed hole collection at the electrode 430, so that detector 400 can employ a single-polarity detection mode that collects the electrons at electrode 420 without a significant overlapping hole collection signal. Charge measurement electronics 440 in detector 400 may thus analyze a measurement signal with a shape depending on electron mobility (not on hole mobility) and may provide an accurate measurement of the energy of the radiation particle that freed the electrons.

Figure 5:
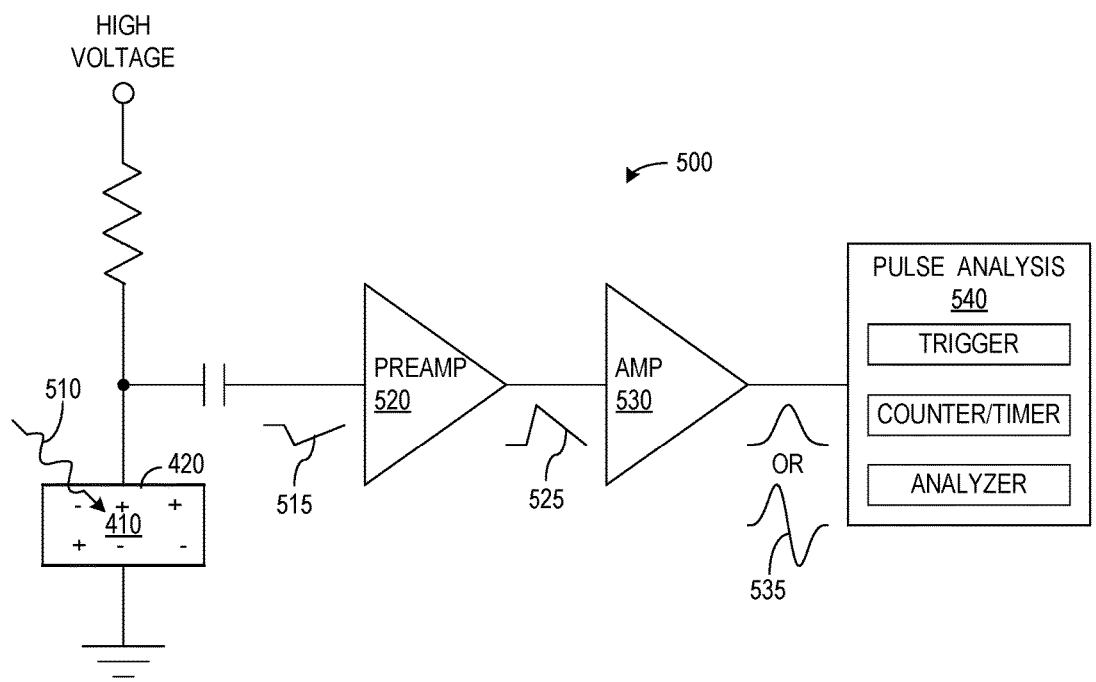
FIG. 5 is a schematic diagram of simple signal processing electronics applied in an electrostatic hole trapping detector.

FIG. 5 shows a schematic diagram illustrating operation of simple signal processing electronics 500 that may be utilized in EHT detector 400. As shown, an incident radiation quantum 510 interacts in the EHT semiconductor 410 and deposits energy that due to detector bias is converted into a current pulse 515 through electrode 420. The current pulse 515 is sent to a preamplifier 520, e.g., a charge sensing preamplifier, which has charge sensitive configuration integrating the transient current pulse to produce a voltage step 525. A shaping amplifier 530 converts the preamplifier output signal 525 producing an output voltage pulse 535 with height proportional to the deposited charge. The shaped pulse 535 is sent to pulse analysis circuits 540 that select pulses for further processing and analyzes selected pulses to measure radiation, e.g., determine the energy of radiation interacting with semiconductor block 410. This selection/processing circuitry 540 may include a trigger, for example, an integral discriminator that selects all pulses with pulse height above a certain threshold or a differential discriminator that selects pulses with peak amplitude between upper and lower thresholds. The trigger is used in cases when further pulse processing requires the detector to be triggered within a narrow time interval. Selected events may then be processed to produce a result that depends on the accumulation of many individual pulses over a defined measurement time. A simple example uses a counter, which counts the number of selected events over a finite time period. A more complex example may use a multichannel analyzer that measures the pulse height for each of a series of selected events and assigns the height to one of many pulse height channels. Known implementations of pulse analysis circuits, which are used in current radiation detectors, may also be employ in circuit 540 in implementations of EHT detectors disclosed herein.

Use of a single polarity (FIG. 5) Electrostatic Hole Trapping (EHT) detectors improves performance of radiation detectors and reduces the complexity of the signal management electronics when compared to conventional radiation detectors. An important aspect of Electrostatic Hole Trapping Detectors is elimination of a dual-voltage bias of the detector electrodes in Coplanar Grid Detectors and hence reducing the effect of a high voltage at the input of high sensitivity preamplifier improving both performance and reliability of EHT detectors.

Figure 6:
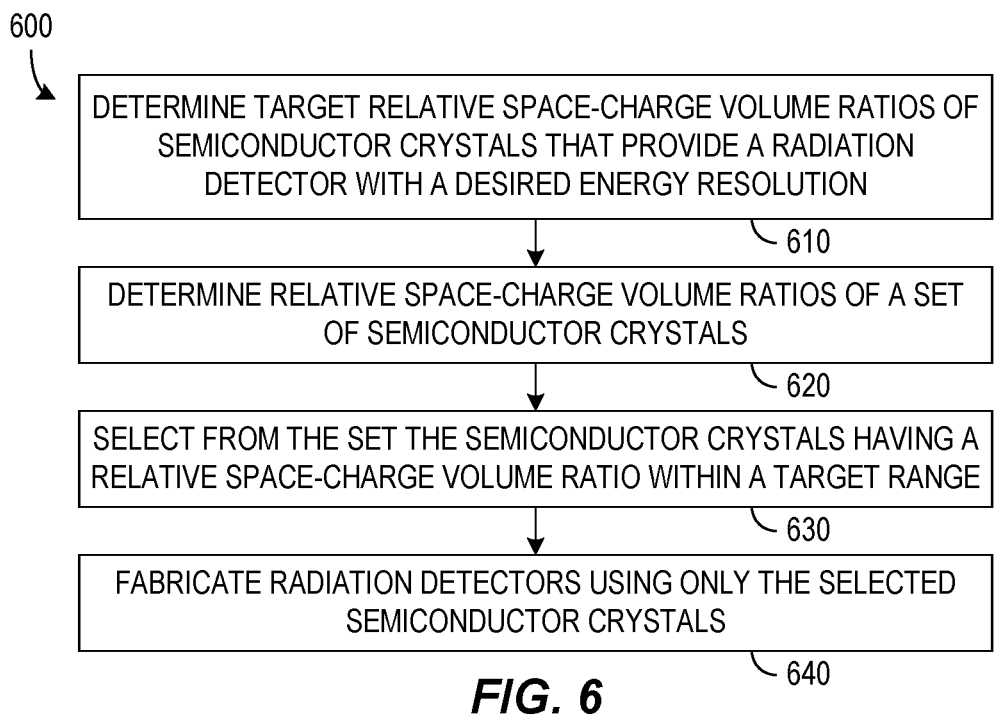
FIG. 6 is a flow diagram of a process for characterizing and fabricating EHT detectors according to one implementation.

FIG. 6 is a flow diagram of a process 600 for fabrication of EHT detectors. Process 600 in a preliminary block 610 determines a target space-charge volume ratio $V_{sc}/V$ that provides a particular detector with a desired performance. For example, block 610 may be completed by identifying a set of semiconductor crystals that have a range of different measured space-charge volume ratios $V_{sc}/V$. A set of test detectors can then be constructed using the set of semiconductor crystals, and the performance, e.g., the energy resolutions, of the test detectors can be measured. Based on the performance measurements, a target space-charge volume ratio $V_{sc}/V$ can be determined that provides the desired detector performance. For detector fabrication, a block 620 of process 600 determines the space-charge volume ratio $V_{sc}/V$ of a set of semiconductor crystals, and a block 630 selects from the set of semiconductor crystals only the crystals having a space-charge volume within the target range. Process block 630 may further selects only the crystals having a target density of electron trapping centers, e.g., a suitably low concentration of electron trapping centers. Detectors may then be manufactured per block 640 using only the selected semiconductor crystals, e.g., only the crystals determined to have a space-charge volume ratio within the target range. Processing steps used in detector fabrication 640 are known in the art and may include chemical and thermal treatment of the semiconductor crystals during formation of features such as contacts and surface passivation and connection of the semiconductor crystals to associated charge measuring electronic.

Figure 7:
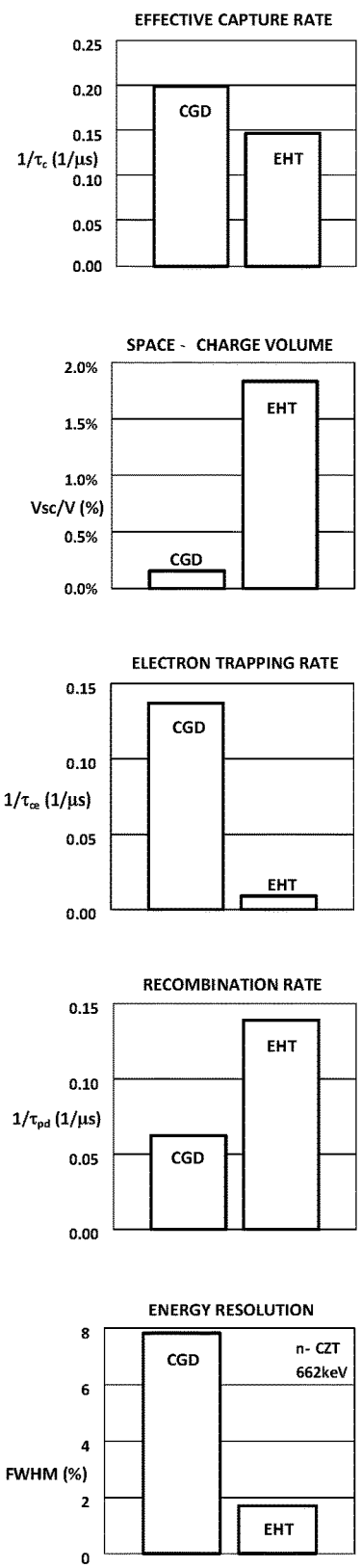
FIG. 7. shows plots comparing performance factors of a conventional coplanar grid detector and an electrostatic hole trapping detector as disclosed herein.

FIG. 7 shows comparisons of characteristics of a Coplanar Grid Detector (CGD) and an Electrostatic Hole Trapping (EHT) detector based on the DSLA characterization procedures described above. Two samples selected for this comparison had close values of the "mu-tau products" and effective capture rates determined using DSLA methodology. However, the samples exhibited significantly different relative space-charge volumes and significantly different electron trapping rates. As a result, the Electrostatically Hole Trapping detector provided substantially better energy resolution (lower FWHM) than did the Coplanar Grid Detector.

The observed improvement of energy resolution may be attributed to combination of two factors, decrease of the electron trapping rate and suppression of the crystal polarization phenomenon due to reduction of the free hole density outside of the space-charge regions of extended defects. Capability of identifying these effects is an important factor in optimization of the crystal growth process and selection of the crystals for the EHT radiation detector using DSLA metrology. This is particularly important for suppression of the polarization effect which is one of the major operating problems in the high-flux X-ray detectors operating in the photon counting mode.

In both CGD and EHT detectors of FIG. 7, the collection efficiency of carriers at the electrode depends on the depth of the particle interaction with the semiconductor resulting in a depth dependent signal. Lowering electron trapping, aided by DSLA metrology, may improve performance of the EHT detectors reducing dependence on the depth of the particle interaction with the semiconductor. The effect of depth dependence of the detection signal can be also reduced utilizing depth sensing methods used in the CGD detectors, which are known in the art. Further improvement may be achieved using multi-pixel anode electrode and the small pixel effect, which is also known for conventional radiation detectors. [See e.g., Glenn F. Knoll, Radiation Detection and Measurement (John Wiley & Sons, Inc., 4th ed., 2010, Chapter 13.]

The DSLA metrology, which may be used to identify semiconductor crystals that have a target trapping characteristics for an EHT radiation detector, may also be used to monitor semiconductor growth process and identify specific process that produce semiconductor crystals having desired trapping characteristic.

Although particular implementations have been disclosed, these implementations are only examples and should not be taken as limitations. Various adaptations and combinations of features of the implementations disclosed are within the scope of the following claims.

What is claimed is:

1. A radiation detector comprising:
   a semiconductor block having a space-charge volume ratio for defects that electrostatically trap holes, the space-charge volume ratio being identified as having a non-zero value at which the defects improve performance of the radiation detector, wherein the non-zero value was predetermined to provide the radiation detector with a desired energy resolution; and
   a circuit coupled to collect electrons from the semiconductor block.

2. The radiation detector of claim 1, wherein the semiconductor is a high Z semiconductor.

3. The radiation detector of claim 2, wherein the semiconductor is selected from a group consisting of CdZnTe, $HgI_2$, CdTe, and CdMnTe.

4. The radiation detector of claim 1, wherein the defects include extended defects electrostatically trapping minority carriers.

5. The radiation detector of claim 1, wherein the defects prevent holes generated by a quantum of radiation from being collected by the circuit while the circuit collects electrons generated by the quantum of radiation.

6. The radiation detector of claim 1, wherein the circuit comprises;
   an anode on the semiconductor block;
   a charge sensing preamplifier coupled to the anode;
   a shaping amplifier coupled to the charge sensing preamplifier; and
   pulse analysis circuit coupled to the shaping amplifier.

7. The radiation detector of claim 6, wherein the pulse analysis circuitry includes a discriminator or trigger, counter/timer, and a multichannel analyzer.

8. The radiation detector of claim 1, wherein the circuit implements a single-polarity charge sensing mode that collects electrons while holes are electrostatically trapped by the defects.

9. The radiation detector of claim 1, wherein while the circuit collects electrons that a quantum of radiation generates in the block, the defects prevent the circuit from collecting holes that the quantum of radiation generates in the semiconductor block.

10. The radiation detector of claim 9, wherein the non-zero value is lower than a concentration of the defects that would interfere with a carrier mobility in the semiconductor block.

11. A method for manufacturing a radiation detector, comprising:
    performing Defect Specific Lifetime Analysis (DSLA) on a plurality of semiconductor blocks to determine for each of the semiconductor blocks a space-charge volume ratio for defects that electrostatically trap holes within the semiconductor block;
    selecting, based on the space-charge volume ratios, a selected block from among the semiconductor blocks, wherein the selecting requires that the space-charge volume ratio of the selected block be determined by the DSLA to be within a range that prevents holes generated by a quantum of radiation in the selected block from being collected while electrons generated by the quantum of radiation in the selected block are being collected; and
    connecting a charge collection circuit to the select block.

12. The method of claim 11, wherein selecting from among the semiconductor blocks, comprises selecting the selected block based on density of electron trapping centers.

13. The method of claim 11, further comprising fabricating radiation detectors only with the semiconductor blocks having their space-charge volume ratios within the range.

14. The method of claim 11, wherein the range excludes space-charge volume ratios that are so high that the defects interfere with a carrier mobility in the semiconductor block.

* * * * *